(12) United States Patent
Lui et al.

(10) Patent No.: US 11,869,967 B2
(45) Date of Patent: Jan. 9, 2024

(54) BOTTOM SOURCE TRENCH MOSFET WITH SHIELD ELECTRODE

(71) Applicant: Alpha and Omega Semiconductor International LP, Toronto (CA)

(72) Inventors: Sik Lui, Sunnyvale, CA (US); Madhur Bobde, Sunnyvale, CA (US); Lingpeng Guan, San Jose, CA (US); Lei Zhang, Portland, OR (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 176 days.

(21) Appl. No.: 17/401,183

(22) Filed: Aug. 12, 2021

(65) Prior Publication Data

US 2023/0049581 A1 Feb. 16, 2023

(51) Int. Cl.
*H01L 29/78* (2006.01)
*H01L 29/10* (2006.01)
(Continued)

(52) U.S. Cl.
CPC ........ *H01L 29/781* (2013.01); *H01L 29/1095* (2013.01); *H01L 29/401* (2013.01);
(Continued)

(58) Field of Classification Search
CPC ............. H01L 29/781; H01L 29/66734; H01L 29/7813
See application file for complete search history.

(56) References Cited

U.S. PATENT DOCUMENTS

| 5,134,448 A | 7/1992 | Johnsen et al. |
| 5,473,176 A | 12/1995 | Kakumoto |

(Continued)

FOREIGN PATENT DOCUMENTS

| CN | 1464562 A | 12/2003 |
| CN | 1240138 C | 2/2006 |
| JP | H07122749 A | 5/1995 |

OTHER PUBLICATIONS

Boyi Yang et al., "NexFET generation 2, new way to power," 2011 International Electron Devices Meeting, 2011, p. 26.1.1-26.1.4, doi: 10.1109/IEDM.2011.6131615.

*Primary Examiner* — Joseph C. Nicely
(74) *Attorney, Agent, or Firm* — JDI PATENT; Joshua D. Isenberg; Robert Pullman

(57) ABSTRACT

An improved inverted field-effect-transistor semiconductor device and method of making thereof may comprise a source layer on a bottom and a drain disposed on a top of a semiconductor substrate and a vertical current conducting channel between the source layer and the drain controlled by a trench gate electrode disposed in a gate trench lined with an insulating material. A heavily doped drain region is disposed near the top of the substrate surrounding an upper portion of a shield trench and the gate trench. A doped body contact region is disposed in the substrate and surrounding a lower portion of the shield trench. A shield electrode extends upward from the source layer in the shield trench for electrically shorting the source layer and the body region wherein the shield structure extends upward to a heavily doped drain region and is insulated from the heavily doped drain region to act as a shield electrode.

20 Claims, 8 Drawing Sheets

(51) Int. Cl.
*H01L 29/66* (2006.01)
*H01L 29/40* (2006.01)

(52) U.S. Cl.
CPC ...... *H01L 29/407* (2013.01); *H01L 29/66734* (2013.01); *H01L 29/7813* (2013.01)

(56) References Cited

U.S. PATENT DOCUMENTS

| | | |
|---|---|---|
| 5,637,898 A | 6/1997 | Baliga |
| 5,998,833 A | 12/1999 | Baliga |
| 6,373,097 B1 | 4/2002 | Werner |
| 6,906,380 B1 | 6/2005 | Pattanayak et al. |
| 6,987,305 B2 | 1/2006 | He et al. |
| 7,446,374 B2 | 11/2008 | Thorup et al. |
| 7,633,120 B2 | 12/2009 | Hébert |
| 8,008,716 B2 | 8/2011 | Lui et al. |
| 8,357,973 B2 | 1/2013 | Lui et al. |
| 9,530,882 B1 * | 12/2016 | Hsieh ................. H01L 29/7811 |
| 2006/0113589 A1 | 6/2006 | Jones |
| 2008/0067584 A1 * | 3/2008 | Lui ...................... H01L 29/781 438/273 |
| 2012/0025301 A1 * | 2/2012 | Lui ...................... H01L 29/781 438/237 |

* cited by examiner

BOTTOM SOURCE TRENCH MOSFET WITH SHIELD ELECTRODE

FIELD OF THE INVENTION

Aspects of the present disclosure are related generally to semiconductor power devices. More specifically the present disclosure relates to Inverted-trench grounded Field Effect Transistors (FETs).

BACKGROUND OF THE INVENTION

Package sizes for semiconductor power devices such as Metal Oxide Semiconductor Field Effect Transistors (MOSFETs) are ever shrinking. Recent developments in FETs have led to the creation three dimensional stacked power devices for voltage regulators (so called "buck converters"). These three-dimensional stacked devices utilize a bottom source Lateral Double defused MOSFET (LD MOSFET). While the LD MOSFET design allows for stacking, the LD MOSFETs have low channel density and require an expensive Complementary MOSFET (CMOS) based process with many masking steps to create.

Thus, it would be beneficial to develop three dimensional stacked power devices using a cheaper transistor device design such as a Trench MOSFET design. One possible trench MOSFET design would be an Inverted—trench grounded Field Effect Transistors (iT-FETs). These designs feature a bottom source and top drain allowing the devices to be stacked easily. These iT-FETs feature increased channel density compared to the LD MOSFETs/One problem with the current designs for iT-FETs is that they have high gate to drain capacitance leading to slower switching speeds and high Resistance from drain to source in the on state ($R_{ds-on}$) Additionally current processes for manufacture feature a complicated and expensive process flow.

Thus, there is a need in the art, for an iT-FET with reduced $R_{ds-on}$, faster switching speeds and a better manufacturing process flows.

BRIEF DESCRIPTION OF THE DRAWINGS

The teachings of the present disclosure can be readily understood by considering the following detailed description in conjunction with the accompanying drawings, in which.

DESCRIPTION OF THE SPECIFIC EMBODIMENTS

Figure 1:
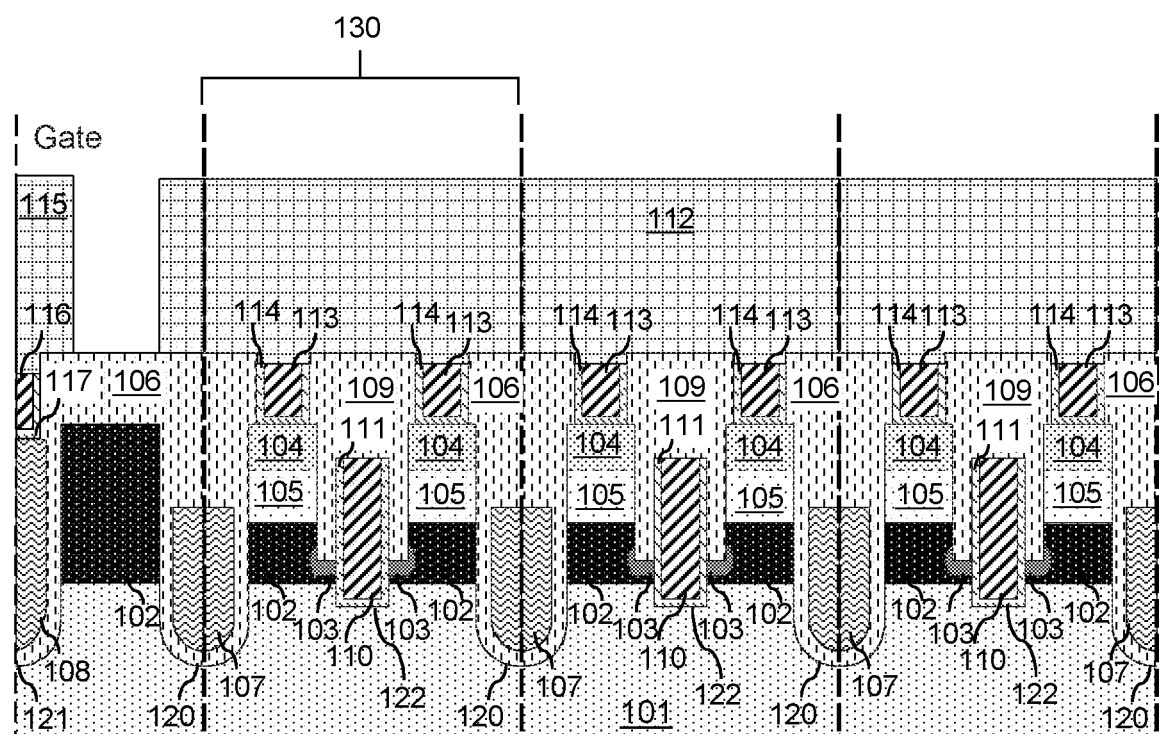
FIG. 1 shows a side cut away view of an improved iT-FET device having combination source-body short and shield electrode according to aspects of the present disclosure.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the interest of clarity, not all of the routine features of the implementations described herein are shown and described. It will be understood by those skilled in the art that in the development of any such implementations, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of the present disclosure.

In accordance with aspects of the present disclosure, the components, process steps, and/or data structures may be implemented using various types of operating systems; computing platforms; user interfaces/displays, including personal or laptop computers, video game consoles, PDAs and other handheld devices, such as cellular telephones, tablet computers, portable gaming devices; and/or general purpose machines. In addition, those of ordinary skill in the art will recognize that devices of a less general purpose nature, such as hardwired devices, field programmable gate arrays (FPGs), application specific integrated circuits (ASICs), or the like, may also be used without departing from the scope and spirit of the inventive concepts disclosed herein.

The disclosure herein refers silicon doped with impurities of a first conductivity type or a second conductivity. The ionized impurities of the first conductivity type may be opposite ionized impurities of a second conductivity type. For example, impurities of the first conductivity type may be n-type, which create electron carriers when doped into silicon. Impurities of the first conductivity type include phosphorus, antimony, bismuth, lithium and arsenic. Impurities of the second conductivity may be p-type, which create holes carriers when doped into silicon and in this way are referred to as being the opposite of n-type. P-type type impurities include boron, aluminum, gallium and indium. While the above description referred to n-type as the first conductivity type and p-type as the second conductivity the disclosure is not so limited, p-type may be the first conductivity and n-type may be second the conductivity type.

In the following Detailed Description, reference is made to the accompanying drawings, which form a part hereof, and in which is shown by way of illustration specific embodiments in which the invention may be practiced. For convenience, use of + or − after a designation of conductivity or net impurity carrier type (p or n) refers generally to a relative degree of concentration of designated type of net impurity carriers within a semiconductor material. In general, terms, an n+ material has a higher n type net dopant (e.g., electron) concentration than an n material, and an n material has a higher carrier concentration than an n− material. Similarly, a p+ material has a higher p type net dopant (e.g., hole) concentration than a p material, and a p material has a higher concentration than a p− material. It is noted that what is relevant is the net concentration of the carriers, not necessarily dopants. For example, a material may be heavily doped with n-type dopants but still have a relatively low net carrier concentration if the material is also sufficiently counter-doped with p-type dopants. As used herein, a concentration of dopants less than about $10^{16}/cm^3$ may be regarded as "lightly doped" and a concentration of dopants greater than about $10^{17}/cm^3$ may be regarded as "heavily doped".

A major feature lacking from current designs is for iT-FETs is, an effective shield electrode to reduce the $R_{ds-on}$. The shield electrode reduces the coupling of the drain to the gate thus reducing the Miller's effects to drive the gate ($Q_{gd}$) and increasing the switching speed through the 'shield effect'. A typical iT-FET structure includes a short from the source layer of the substrate to a body region. In prior art implementations, this short region was included in the gate trench or in separate trenches that are formed at larger intervals than the gate interval in the device. An insight in the current disclosure is that the source-body contact and shield electrode may be combined to improve $Q_{gd}$ and switching speed as well as $R_{ds-on}$.

The improved inverted field-effect-transistor (iT-FET) semiconductor device may comprise a source layer on a bottom and a drain disposed on a top of a semiconductor substrate and a vertical current conducting channel between the source layer and the drain controlled by a trench gate disposed in a gate trench lined with an insulating material. A drain contact region is disposed near the top of the substrate surrounding an upper portion of a shield trench and the gate trench. A doped body region is disposed in the substrate and surrounding a lower portion of the shield trench. A shield structure extends upward from the source layer in the shield trench for electrically shorting the source layer and the body region wherein the shield structure extends upward into a drain region and is insulated from the drain region to act as a shield electrode. The shield structure may extend from a bottom of the drain through the shield trench and body region to the source layer. The shield structure may further comprise a conductive plug extending upward from the source layer in the shield trench through the body region to at least part of the drain region. The shield structure further may comprise a titanium silicide plug extending upward from the source layer in the shield trench. Alternatively, the shield structure may further comprise a cobalt silicide plug extending upward from the source in the shield trench.

The source layer of the semi-conductor substrate may be heavily doped with impurities of a first conductivity type and the semi-conductor substrate may further include an epitaxial layer formed on top of the source layer, doped with impurities of a second conductivity type. The doped body region may also be formed in the epitaxial layer by implanting impurities of the second conductivity type. The drain region consists of a heavily doped region and a lighter doped region of the first conductivity type. The lighter doped region is also known as the drift region. The heavily doped region may be formed in the epitaxial layer implanting impurities of the first conductivity type. A drift region may be created between the body region and the heavily doped region in the epitaxial layer. The drift region may be more lightly doped with impurities of the first conductivity type than the heavily doped region. The drift region may have an impurity concentration gradient wherein the impurity concentration is highest near the heavily doped drain region and the impurity concentration gradient decreases deeper into the epitaxial layer below the heavily doped drain region. A conductive drain contact plug may be in contact with heavily doped the drain region and the drain.

Device

FIG. 1 shows a side cut away view of the improved iT-FET device having combination source-body short and shield electrode according to aspects of the present disclosure. The device includes a bottom source layer 101 formed in the semiconductor substrate. The source layer may be heavily doped with impurities of the first conductivity type. An epitaxial layer 102 may be disposed on top of the source layer 101. The epitaxial layer 102 may be lightly doped with impurities of the second conductivity type which also forms the body of the device. In an upper region of the epitaxial layer 102 of the semiconductor substrate, a heavily doped drain region 104 may be formed. The heavily doped drain region 104 may be heavily doped with impurities of the first conductivity type. A drift region 105 may be formed between the heavily doped drain region 104 and the epitaxial layer/body region 102. The drift region may be doped with impurities of the first conductivity type at lesser concentration relative to the heavily doped drain region 104. In some implementations, the drift regions 105 may be doped with a decreasing concentration gradient into the epitaxial layer with the highest dopant concentration located near the heavily doped drain region 104. The concentration of ions decreases closer to the epitaxial layer 102. On top of the heavily doped drain region 104, a drain contact plug 113 may be disposed. The drain contact plug 113 may include a silicide and a diffusion barrier 114 to improve contact resistance to the drain region 104 and device reliability. For example and without limitation the diffusion barrier 114 may be a metal silicide of titanium or cobalt and titanium nitride and the drain contact plug 113 may be a metal such as tungsten. A drain metal (also referred herein as 'the drain') 112 is disposed on top of the of the drain contact plug 113 and contacts and connects the drain contact plug 113 to function as a drain terminal. The drain metal may be metal such as copper, or aluminum.

A vertical channel may be formed in the body region 102 between the drain 112 and the source layer 101 controlled by a gate electrode 107. The gate electrode 107 is disposed on an insulating layer 106 in a gate trench 120. The gate trench 120 is lined with the insulating material 106 and the insulating material 106 insulates the gate electrode 107 from the semiconductor substrate in a device active area. A gate runner electrode 108 in a gate runner region of the semiconductor substrate in a device termination area may control the gate electrodes 107. The gate runner 108 may be disposed on insulating material 106 lining the gate runner trench 121. The gate runner 108 may be electrically coupled to the gate electrodes 107. As shown, the gate runner 108 may be conductively coupled to a gate metal 115 through a gate runner contact plug 116. The gate runner contact plug 116 may have a complementary material coating 117 similar to the drain contact plug. The gate runner contact plug 116 may include a metal silicide with a complementary diffusion barrier 114 to improve contact resistance to the gate runner 108 and device reliability. For example and without limitation, the gate runner contact plug 116 may be a metal such as tungsten and the diffusion barrier 114 may be a metal silicide of titanium or cobalt and titanium nitride. The gate runner 108 and gate electrodes 107 may be made from a conductive material such as a metal or polycrystalline silicon. The insulating material 106 may be a silicon oxide layer.

A shield electrode 110 may be disposed in a shield trench 122 between adjacent gate trenches 120 in the device active area. As shown, the shield trench 122 may be disposed between adjacent drain contact plugs 113 and the drain plugs 113 may be disposed in spaces between the gate trenches 120 and the shield trenches 122. The Shield electrode 110 also acts as an electrically conductive short between the source layer and the body region. As such, the shield electrode 110 is in conductive contact with the source layer 101 and the body region 102. The body region 102 surrounds a lower portion of the shield trench 122. The drain region 104 surrounds an upper portion of the shield trench 122 and a drift region 105 may surround the shield trench 122 below the heavily doped drain region 104. The bottom of the shield trench 122 is located in the source layer 101. The shield electrode 110 extends upward from the source layer 101 through the body region 102. A shield insulator 109 lines the sidewalls of the shield trench 122 above the body region 102 insulating the shield electrode 110 from heavily doped drain region 104 and the drift region 105. A body contact region 103 having the same conductivity type as the body region 102 but a higher doping concentration may be formed proximate the bottom of the shield trench to provide ohmic contact between the body region 102 and the shield electrode 110. Shield electrode 110 may extend upward through the drift region 105 and into the heavily doped drain region 104. The insulator layer 109 between the shield electrode 110 and the heavily doped drain region 104 and the drift region 105 may be thicker than the insulator layer 106 between the gate 107 and the source 120, body region 102 and drift region 105.

During operation, the shield electrode 110 may induce the shield effect when the device is in the off state and thus allows more heavily doped drift region resulting a lower $R_{ds-on}$. Similar to the gate contact, and the drain contact, the shield electrode 110 may include a complementary material coating 111 such as for example and without limitation, tungsten. The Shield electrode 110 may be a metal such as for example a silicide of titanium or cobalt or a suitable alloy thereof. The shield insulator 109 may be any suitable insulating material such as silicon dioxide. The trench gate design of the improved iT-FET according to aspects of the present disclosure allows for a greater device density along with improved switching time characteristics and a reduced $R_{ds-on}$. The pitch of device cells 130 may be 0.7 to 1.2 micrometers. The gate 107 is recessed to reduce the overlap to the heavily doped drain region 104 and drift region 105 resulting in lower gate-drain capacitance ($C_{gd}$).

Method of Making

Figure 2A:
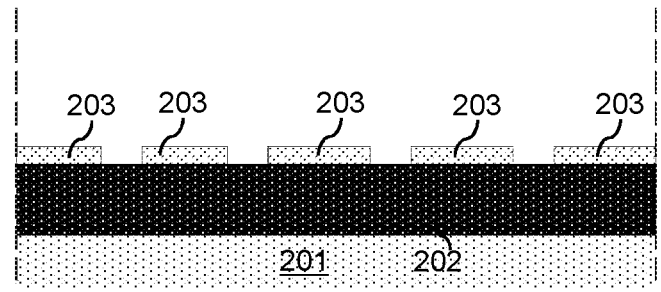
FIG. 2A shows a cross section view of a source layer and epitaxial layer of a semiconductor substrate during formation of the improved iT-FET according to aspects of the present disclosure.
Figure 2B:
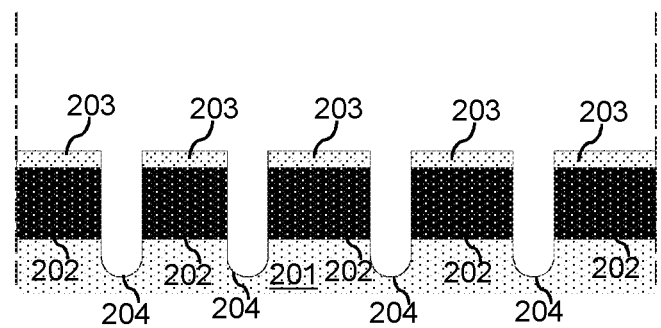
FIG. 2B depicts a side view cross section of the formation of gate trench in the improved iT-FET device according to aspects of the present disclosure.
Figure 2C:
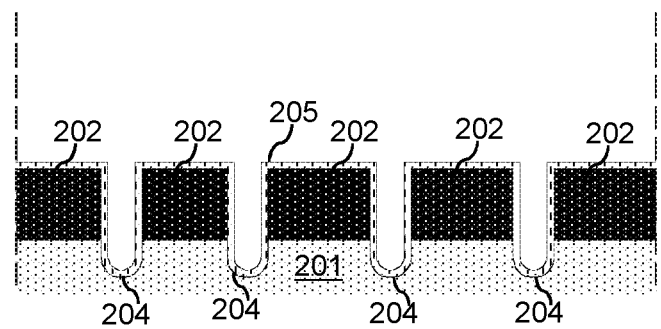
FIG. 2C shows a side view cross section of a step in formation of the gate insulator in the improved iT-FET device according to aspects of the present disclosure.
Figure 2D:
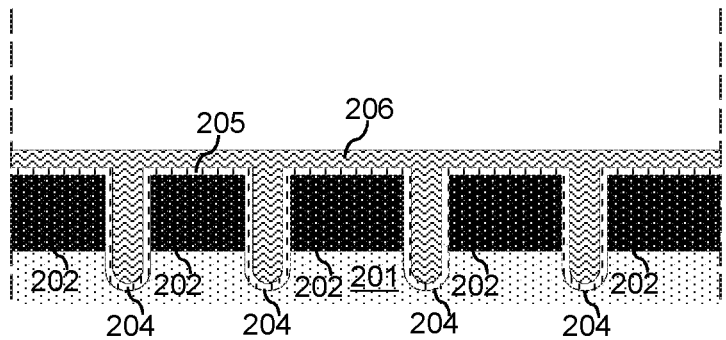
FIG. 2D depicts a side view cross section of a step in the formation of the gate electrode in the improved iT-FET device according to aspects of the present disclosure.
Figure 2E:
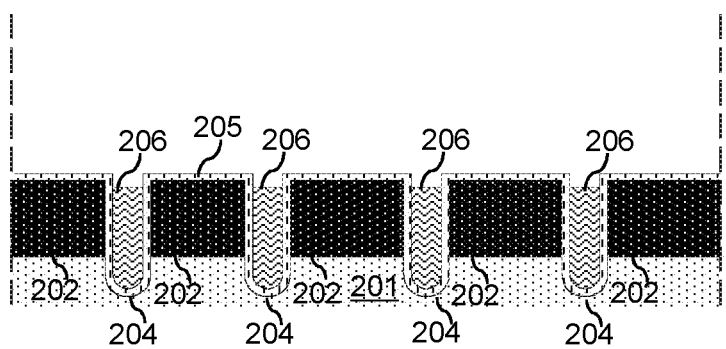
FIG. 2E shows a side view cross section of a step in the formation of the gate electrode in the improved iT-FET device according to aspects of the present disclosure.
Figure 2F:
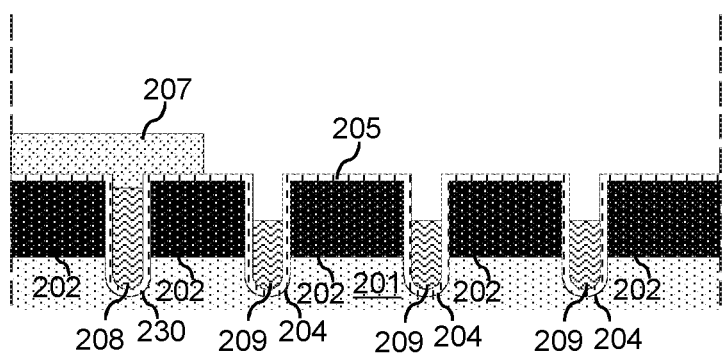
FIG. 2F depicts a side view cross section of a step in the formation of the gate electrode and Gate runner in the improved iT-FET device according to aspects of the present disclosure.
Figure 2G:
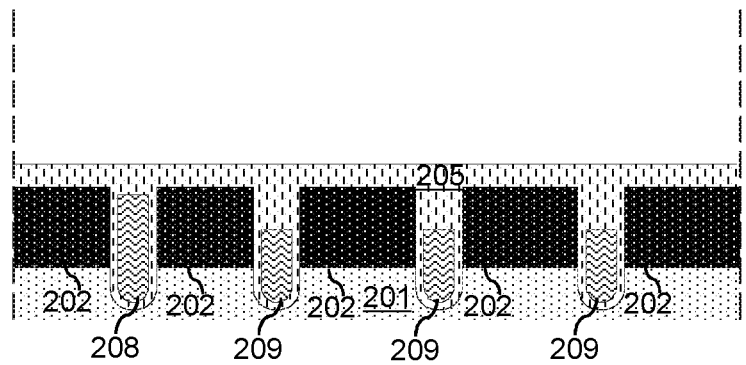
FIG. 2G shows a side view cross section of a step in the formation of the gate electrode and Gate runner in the improved iT-FET device according to aspects of the present disclosure.
Figure 2H:
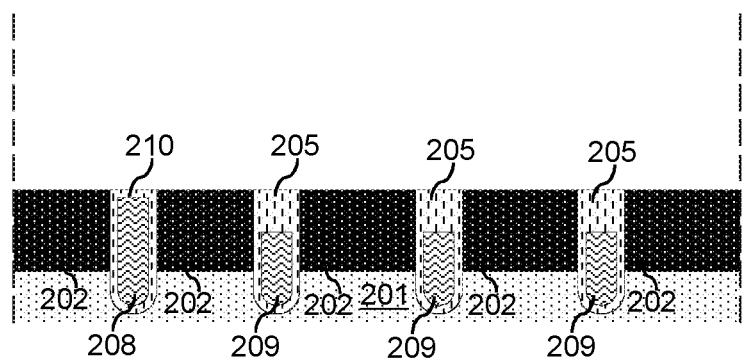
FIG. 2H depicts a side view cross section of a step in the formation of the gate electrode and Gate runner in the improved iT-FET device according to aspects of the present disclosure.
Figure 2I:
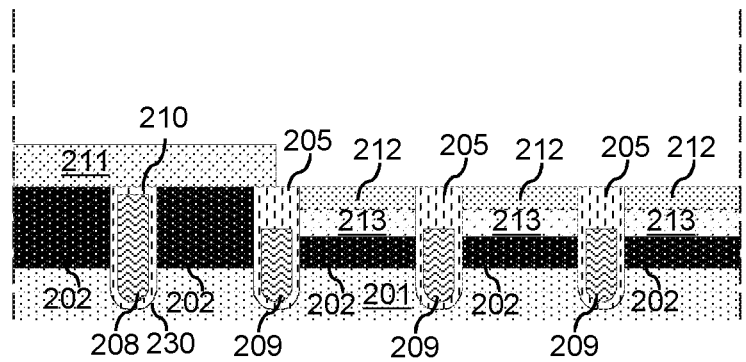
FIG. 2I depicts a side view cross section of a step in the formation of the drain contact region and drift region in the improved iT-FET device according to aspects of the present disclosure.
Figure 2J:
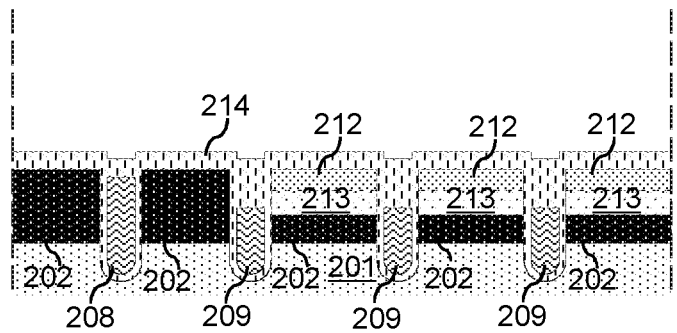
FIG. 2J shows a side view cross section of a step in the planarization prior to formation of the shield structure in the improved iT-FET device according to aspects of the present disclosure.
Figure 2K:
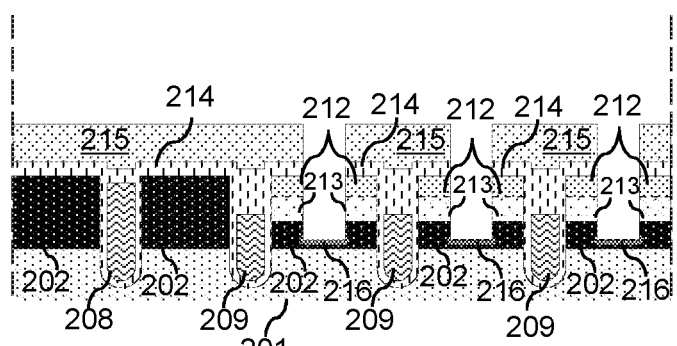
FIG. 2K depicts a side view cross section of a step in the formation of the source-body short and the shield structure in the improved iT-FET device according to aspects of the present disclosure.
Figure 2L:
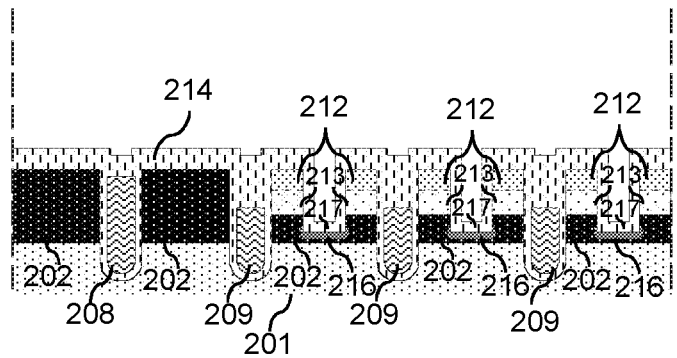
FIG. 2L shows a side view cross section of a step in the formation of source-body short and the shield structure in the improved iT-FET device according to aspects of the present disclosure.
Figure 2M:
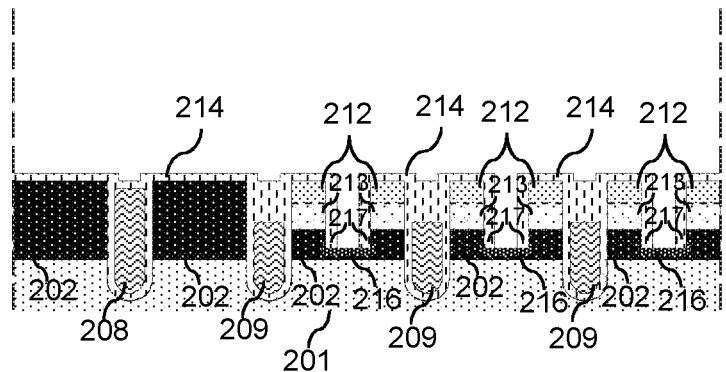
FIG. 2M depicts a side view cross section of a step in the formation of the source-body short and the shield structure in the improved iT-FET device according to aspects of the present disclosure.
Figure 2N:
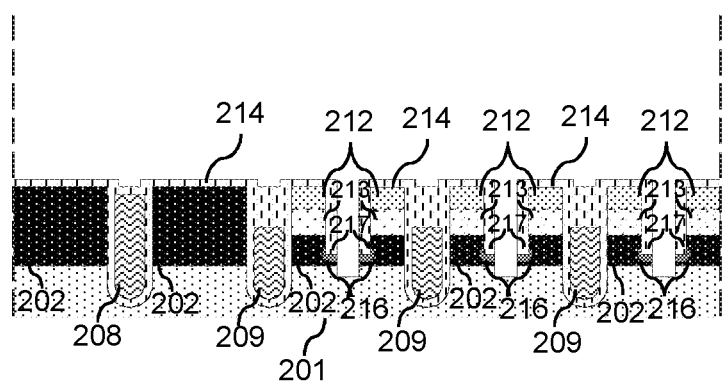
FIG. 2N shows a side view cross section of a step in the formation of the source-body short and the shield structure in the improved iT-FET device according to aspects of the present disclosure.
Figure 2O:
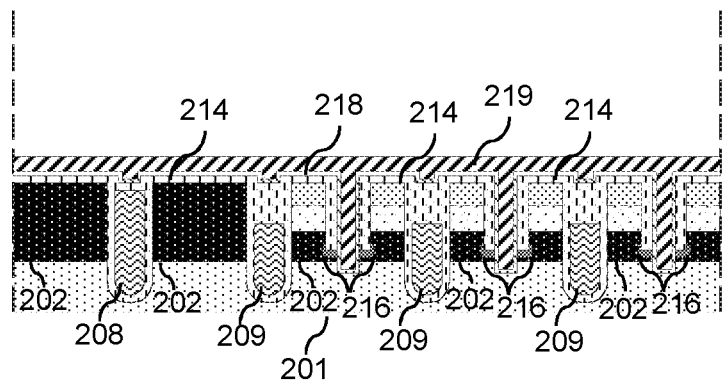
FIG. 2O depicts a side view cross section of a step in the formation of the source-body short and the shield structure in the improved iT-FET device according to aspects of the present disclosure.
Figure 2P:
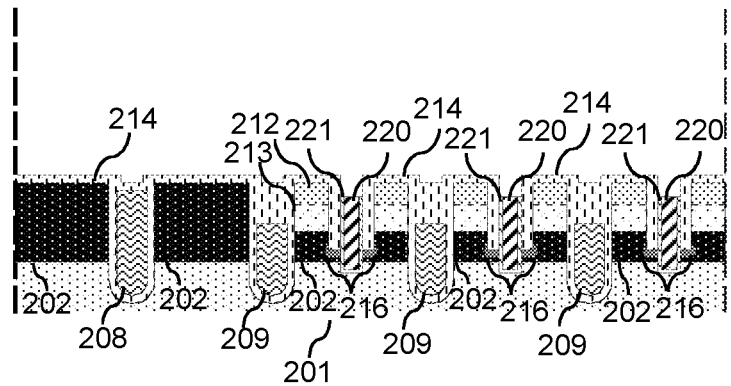
FIG. 2P shows a side view cross section of a step in the formation of the source-body short and the shield structure in the improved iT-FET device according to aspects of the present disclosure.
Figure 2Q:
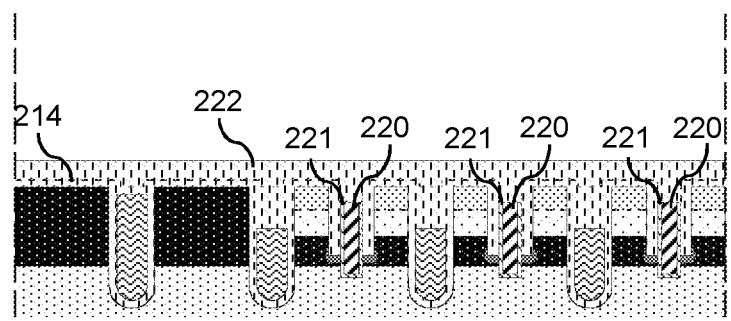
FIG. 2Q shows a side view cross section of a step in the planarization prior to contact formation structure in the improved iT-FET device according to aspects of the present disclosure.
Figure 2R:
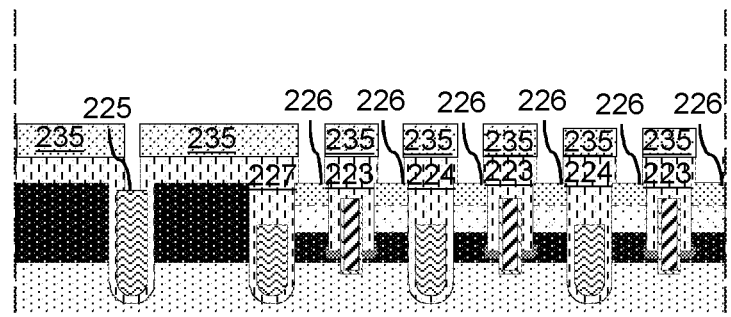
FIG. 2R depicts a side view cross section of a step in the formation of the drain contact openings and gate contact openings in the improved iT-FET device according to aspects of the present disclosure.
Figure 2S:
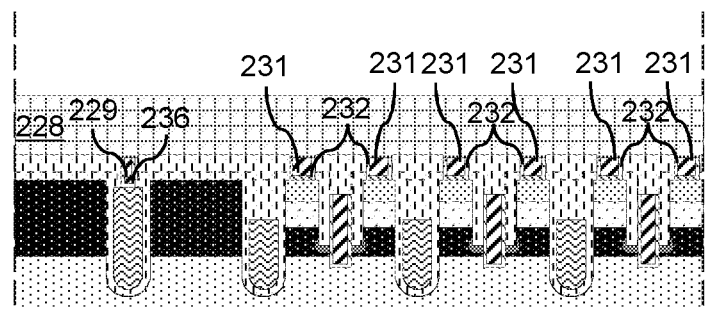
FIG. 2S shows a side view cross section of a step in the formation of the drain contact plugs and gate contact plugs in the improved iT-FET device according to aspects of the present disclosure.
Figure 2T:
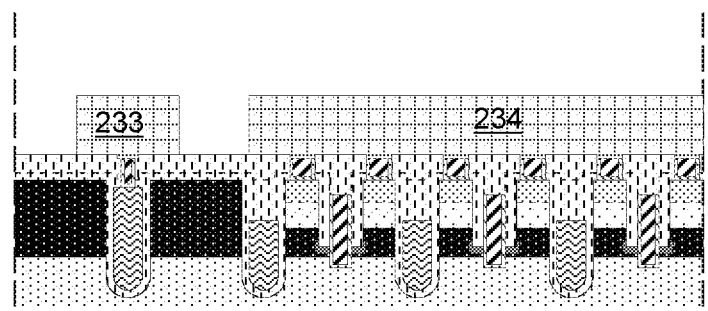
FIG. 2T depicts a side view cross section of a step in the formation of the drain metal and gate metal runner in the improved iT-FET device according to aspects of the present disclosure.

FIGS. 2A-2T depicts a cross sectional view of the method for making the improved iT-FET device according to aspects of the present disclosure. FIG. 2A shows a cross section view of the source layer and epitaxial layer of the semiconductor substrate during formation of the improved iT-FET according to aspects of the present disclosure. Initially, the semiconductor substrate includes the source layer 201 heavily doped with ions of the first conductivity type. An epitaxial layer 202 may be formed on a major surface of the source layer 201. The epitaxial layer 202 may be lightly doped with ions of the second conductivity type and may be grown on the surface of the source layer using atmospheric or reduce pressure epitaxial process. A gate trench mask 203 may be applied to the major surface of the epitaxial layer 202 in preparation for gate trench formation. The gate trench mask 203 may be formed by any known method for example and without limitation, photolithography, or a patterned oxide layer formed by photolithography and oxide etching.

FIG. 2B depicts a side view cross section of the formation of gate trench in the improved iT-FET device according to aspects of the present disclosure. Gate trenches 204 may be formed in the semiconductors substrate through the epitaxial layer 202 into the source layer 201. The gate trenches 204 may be formed using any known method of etching. For example and without limitation the gate trenches 204 may be created using dry reactive ion etching (DRIE). During the etching process, the gate trench mask 203 prevents etching of portions of the epitaxial layer covered by the mask. The semiconductor substrate is etched in the areas not covered by the mask. After formation of the gate trenches, the mask 203 is removed. The mask 203 may be removed any suitable mask removal method for example chemical etching or plasma ashing.

FIG. 2C shows a side view cross section of a step in formation of the gate in the improved iT-FET device according to aspects of the present disclosure. As shown an insulating layer 205 is blanket deposited on the surface of the epitaxial layer 202. The insulating layer 205 lines the inside of the gate trenches 204. The insulating layer 205 may be a non-conductive material such as for example and without limitation silicon dioxide. The silicon dioxide may be formed by either chemical vapor deposition (CVD) or thermal oxidation.

FIG. 2D depicts a side view cross section of a step in the formation of the gate electrode in the improved iT-FET device according to aspects of the present disclosure. A conductive material may be deposited on the surface of the insulating layer 205 over the epitaxial layer 202 and in the gate trenches 204 to form a gate electrode precursor 206. The conductive material may be for example and without limitation in situ doped polycrystalline silicon. The gate electrode layer 206 may be formed using for example and without limitation CVD.

FIG. 2E shows a side view cross section of a step in the formation of the gate electrode in the improved iT-FET device according to aspects of the present disclosure. The semiconductor substrate top surface is polished to remove conductive material from areas of insulating layer 205 not in the gate trench 204. Thus, the gate electrode layer 206 is limited to within the gate trench 204. The conductive material may be removed by polishing methods for example and without limitation, Chemical Mechanical Polishing or plasma etching processes. Additionally the gate electrode layer 206 may be etched to further reduce the height of the gate electrode in the gate trench from the source layer 201. The gate electrode layer 206 may be etched with any known suitable plasma etching process.

FIG. 2F depicts a side view cross section of a step in the formation of the gate electrode and Gate runner in the improved iT-FET device according to aspects of the present disclosure. A gate runner mask 207 is formed over top of the full height gate electrode 208 in the gate runner region. The gate runner mask 207 may be formed by any known masking method suitable for silicon etching for example and without limitation, the gate runner mask 207 may be a photolithographic mask. The full height gate electrodes are etched after masking 207 the gate runner 208 to create gate electrodes 209 at the appropriate depth in the gate trench 204. The conductive material in the gate runner trench 230 is not etched because it is covered by the gate runner mask 207 forming the gate runner electrode 208. The gate electrodes 209 may be etched in this second etching step with any known suitable polycrystalline silicon or metal etching method depending on the material of the gate electrode precursor.

FIG. 2G shows a side view cross section of a step in the formation of the gate electrode and Gate runner in the improved iT-FET device according to aspects of the present disclosure. The gate runner mask 207 may be removed by any known mask removal method for example and without limitation chemical etching or plasma ashing according to the type of mask used. The insulating layer 205 is deposited to cover the gate electrodes 209 and Gate runner electrode 208. The gate insulating layer 205 may be deposited by any known deposition method for example and without limitation CVD.

FIG. 2H depicts a side view cross section of a step in the formation of the gate electrode and Gate runner in the improved iT-FET device according to aspects of the present disclosure. The top surface of the semiconductor substrate is polished to reveal the surface of the epitaxial layer 202 and reduce the height of the insulating layer 205 near the gate electrodes 209 and the gate runner insulation 210 near the gate runner electrode 208. The semiconductor substrate may be polished by any suitable method such as CMP.

FIG. 2I depicts a side view cross section of a step in the formation of the heavily doped drain region and drift region in the improved iT-FET device according to aspects of the present disclosure. A drain region mask 211 is formed over the non-active transistor region that includes, e.g., the gate runner 208. The drain region mask 211 may extend from an edge of the semiconductor substrate over the gate runner insulation 210 and terminate at the gate insulation 209 nearest the gate runner trench 230. The Epitaxial layer 202 is doped with ions of the first conductivity type. The heavily doped drain region 212 is implanted with a high dose of impurities of the first conductivity type after masking the gate runner region. The drift region 213 is formed by implanting a lower dose of impurities of the first conductivity type at an energy of implantation of between 150 KeV to 500 KeV. The doping of the drift region may be on a gradient with the greatest impurity concentration near the heavily doped drain region 212 and with the gradient decreasing with distance from the heavily doped drain region 212 to the epitaxial layer 202. The gate runner region is protected from doping by the drain region mask leaving a portion of the epitaxial layer 202 un-doped in the non-active transistor region. Doping of the drift region 213 and heavily doped drain region 212 may be performed by any suitable method for example and without limitation ion implantation. The drift doping concentration counter dopes the body dopant in the epitaxial layer.

FIG. 2J shows a side view cross section of a step in the formation of the shield structure in the improved iT-FET device according to aspects of the present disclosure. The heavily doped drain region 212 and drift region 213 may be annealed through heating for example and without limitation, the semi-conductor substrate may be heated in a furnace at around 1000 C for 30-60 mins to anneal the drift region 213 and heavily doped drain region 212. The insulating layer 214 is formed over the top of the semiconductor substrate covering the gate trenches and gate runner trench. The insulating layer may be formed by any oxide layer formation method for example and without limitation CVD or thermal oxidation during the anneal for the heavily doped drain and drift region.

FIG. 2K depicts a side view cross section of a step in the formation of the shield structure in the improved iT-FET device according to aspects of the present disclosure. As shown, a shield trench mask 215 is formed on the semiconductor substrate over the insulating layer 214. The mask is patterned to have gaps in areas between the gate electrodes 209. After formation of the shield trench mask 215 the semiconductor substrate is etched through the openings in the shield trench mask. The etching process forms a shield trench precursor through the heavily doped drain regions 212, drift regions 213 and into the epitaxial layer 202. The etching process may be any suitable silicon dioxide and silicon deep etching method for example and without limitation DRIE. The top of the epitaxial layer 202 at the shield trench precursor is then implanted with ions of the second conductivity type to form the body contact region 216 at the bottom of each of the shield trenches. The body contact region 216 may be implanted, e.g., with Boron at 20 KeV-60 KeV.

FIG. 2L shows a side view cross section of a step in the formation of the shield structure in the improved iT-FET device according to aspects of the present disclosure. The shield trench mask 215 is then removed after implantation of the epitaxial layer with the body contact region 216. The shield trench mask 215 may be removed by any mask removal method for example chemical etching or plasma ashing. The insulating layer 214 is further grown on the surface of the semiconductor substrate and in the shield trench precursors 217. The insulating layer 214 lines the sides and bottom of the shield trench precursor 217 covering the body contact region 216 and sides of the heavily doped drain region 212, drift region 213 and epitaxial layer 202.

FIG. 2M depicts a side view cross section of a step in the formation of the shield structure in the improved iT-FET device according to aspects of the present disclosure. The insulating layer 214 at the bottom of the shield trench precursor 217 is etched away exposing the top surface of the body region 216. DRIE may be used to etch the insulating layer 214 at the bottom of the shield trench precursor 217 without the need for a masking step.

FIG. 2N shows a side view cross section of a step in the formation of the shield structure in the improved iT-FET device according to aspects of the present disclosure. The body contact region 216 and epitaxial layer 202 is then etched in the shield trench precursor 217 to finish the shield trench. A high selective RIE etch is chosen that preferentially etches, e.g., the silicon on the bottom of the trench precursor of the silicon substrate without removing too much silicon dioxide The insulating layer 214 acts also as a mask preventing etching in areas covered by the insulating layer and allowing etching at the bottom of the shield trench precursor 217.

FIG. 2O depicts a side view cross section of a step in the formation of the shield structure in the improved iT-FET device according to aspects of the present disclosure. After formation of the shield trench, a shield trench electrode layer 219 may be formed on the exposed top surfaces of the semiconductor substrate and in the shield trench. The shield trench electrode layer 219 may be a silicide of a metal such as tungsten. The shield trench metal layer 219 may be coated with a complementary material 218 that acts as a diffusion barrier. The complementary material coating 218 may be titanium, cobalt, titanium nitride.

FIG. 2P shows a side view cross section of a step in the formation of the shield structure in the improved iT-FET device according to aspects of the present disclosure. An etch is applied to the shield trench electrode layer, the metal is etched way from the major surface of the gate insulating layer precursor 214. The top surface of the shield trench electrode layer is etched away in the shield trench producing a shield trench electrode 220 coated with a complementary metal coating 221. The etchant may be any etchant selective for the metal used for the shield electrode. The shield trench electrode 220 and coating 221 extends from source layer 201, through the epitaxial layer 202 and the body contact region 216. The Shield trench extends above the body contact region 216 into the drift region 213 and heavily doped drain region 212. The insulating layer 214 thickness is optimized to reduce $R_{ds-on}$ and reliable under voltage potential between the shield trench electrode 220 and the heavily doped drain region 212 and drift region 213. The shield electrode 220 and coating 221 also act as a short connecting the source layer 201 and the epitaxial 202 through the body contact region 216.

FIG. 2Q shows a side view cross section of a step in the formation of the shield structure in the improved iT-FET device according to aspects of the present disclosure. The insulating layer 222 is deposited over the previous insulating 214 over the shield electrode 220 and coating 221. The insulating layer 222 may be for example and without limitation, a silicon dioxide and borophosphosilicate glass (BPSG) applied via CVD. After application of the insulating layer 222, the top surface of the semiconductor substrate may be uneven. The insulating layer 222 may then be planarized to create an even top surface of the semiconductor substrate.

FIG. 2R depicts a side view cross section of a step in the formation of the drain contact and gate contact in the improved iT-FET device according to aspects of the present disclosure. After planarization, a drain electrode mask 235 is applied to the surface of the insulating layer. The drain electrode mask 235 may be applied via any suitable method for example and without limitation, photolithography. An etch is then applied to the top surface of the semiconductor substrate. The etchant removes portions of the insulating layer not covered by the drain electrode mask 235. The heavily doped drain region 226 is exposed after the etching process. Additionally the mask may leave the gate runner electrode 225 exposed after etching. This prepares the top of the semiconductor substrate for formation of drain contacts and a gate runner contact. The insulation layer of the gate runner region 227 is finally defined after this etching as well as the final shapes of the gate insulation 224 and shield insulation 223. The drain contact mask 235 may be removed after etching by any suitable method for mask removal such as chemical washing, plasma ashing or planarization.

FIG. 2S shows a side view cross section of a step in the formation of the drain contact and gate contact in the improved iT-FET device according to aspects of the present disclosure. After the mask is removed, a metal layer may 228 be applied to the top surface of the semiconductor substrate. The metal layer may cover the exposed gate runner electrode 225 forming the gate runner contact plug 229. The gate runner contact may include a complementary metal coating 236. Additionally the metal layer 228 may cover the drain contact region 226 forming the drain contact plug 231. The drain contact plug 231 may include a complementary metal coating 232. The metal coating may be a silicide of a metal for example and without limitation a silicide of titanium, cobalt The complementary metal plug for the drain contact and gate runner contact may be for example and without limitation tungsten.

FIG. 2T depicts a side view cross section of a step in the formation of the drain and gate runner in the improved iT-FET device according to aspects of the present disclosure. A metal layer mask is applied to the surface of the metal layer over the gate runner metal 233 and the drain metal 234. The metal layer mask may be applied by any suitable method such as photolithography. An etching process is applied to the masked metal layer forming the final gate runner metal 233 and drain metal layer 234. The mask may be removed by any suitable process, for example and without limitation chemical etching, plasma ashing. Thus, the improved iT-FET device is created having an internal combination source-body contact and shield electrode. The combination source-body contact and shield electrode decreases the $R_{ds-on}$ for the device through the shield effect. The recess gate electrode reduces the gate to drain capacitance. Additionally the improved iT-FET device may be created with existing trench FET manufacturing equipment with one additional masking step, this decreases the overall manufacturing cost for the improved iT-FET device over the bottom source LDMOS.

Aspects of the present disclosure the one-piece source-body short and shield electrode allows for an improved iT-FET device with a relatively low gate to drain capacitance and lower resistance from drain to source in the on state ($R_{ds-on}$). Such a device configuration allows for faster switching speeds. Furthermore, the process for manufacturing such device can be implemented with a relatively simple and inexpensive process flow.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC § 112, ¶6.

What is claimed is:

1. An inverted field-effect-transistor (iT-FET) semiconductor device, comprising a source layer on a bottom and a drain metal disposed on a top of a semiconductor substrate:
   a vertical current conducting channel between said source layer and said drain metal controlled by a trench gate electrode disposed in a gate trench lined with an insulating material;
   a heavily doped drain region disposed near the top of the substrate surrounding an upper portion of a shield trench and the gate trench;
   a doped body region disposed in the substrate and surrounding a lower portion of the shield trench;
   a shield electrode extending upward from the source layer in the shield trench electrically shorting the source layer and the body region, wherein the shield electrode extends upward to the heavily doped drain region and is insulated from the heavily doped drain region.

2. The iT-FET semiconductor device of claim 1, wherein the shield structure further comprises a conductive plug extending upward from the source layer in the shield trench through the body region to at least part of the drift region.

3. The iT-FET semiconductor device of claim 1, wherein the shield electrode further comprises a tungsten plug extending upward from the source layer in the shield trench.

4. The iT-FET semiconductor device of claim 1, wherein the shield electrode further comprises a titanium silicide plug extending upward from the source in the shield trench.

5. The iT-FET semiconductor device of claim 1, wherein the source layer of the semi-conductor substrate is heavily doped with impurity of a first conductivity type and the semi-conductor substrate further comprises an epitaxial layer formed on top of the source layer, doped with impurity of a second conductivity type, wherein the second conductivity type is opposite of the first conductivity type.

6. The iT-FET semiconductor device of claim 5, wherein the body region is formed in the epitaxial layer and is heavily doped with impurities of the second conductivity type.

7. The iT-FET semiconductor device of claim 5, wherein the heavily doped drain region is formed in the epitaxial layer and is heavily doped with ions of the first conductivity type.

8. The iT-FET semiconductor device of claim 7, wherein an insulator layer between the shield electrode and the heavily doped drain region and the drift region is thicker than portions of the insulating material between the gate electrode and the source layer and body region.

9. The iT-FET semiconductor device of claim 7, further comprising a drift region between the body region and the heavily doped drain region formed in the epitaxial layer wherein the drift region is less heavily doped with impurity of the first conductivity type than the heavily doped drain region.

10. The iT-FET semiconductor device of claim 9, wherein the drift region has an impurity concentration gradient wherein the impurity concentration is highest near the heavily doped drain region and the impurity concentration gradient decreases deeper into the epitaxial layer below the heavily doped drain region.

11. The iT-FET semiconductor device of claim 1, further comprising a conductive drain contact plug in contact with the heavily doped drain region and the drain metal.

12. A method of making an iT-FET semi-conductor device comprising:
   a) forming an epitaxial layer doped with impurities of a second conductivity type on a substrate heavily doped with impurities of a first conductivity type wherein the first conductivity type is opposite of the second conductivity type, wherein the substrate acts as a source layer;
   b) forming a gate trench through the epitaxial layer and into the source layer;
   c) lining the gate trench with an insulating material and forming a gate electrode in the gate trench;
   d) forming a heavily doped drain region doped with impurities of the first conductivity type in the epitaxial layer;

d') forming a drift region doped with impurities of first conductivity type in the epitaxial layer below the heavily doped drain region;

e) forming a shield trench in the epitaxial layer through the heavily doped drain region, and drift region;

f) heavily doping a body contact region with impurities of the second conductivity type at the bottom of the shield trench;

g) lining the shield trench with an insulating material;

h) deepening the shield trench into the source layer through the body contact region and forming a shield structure in the shield trench wherein the shield structure extends upward from the source layer in the shield trench electrically shorting the source region and the body region and wherein the shield structure extends upward into a heavily doped drain region and is insulated from the drain contact region to act as a shield electrode;

i) forming a drain on top of the epitaxial layer.

13. The method of making an iT-FET semiconductor device of claim 12, wherein the shield electrode extends from a bottom of the drain through the shield trench and body region to the source.

14. The method of making an iT-FET semiconductor device of claim 12, wherein forming the shield electrode further comprises forming a conductive plug extending upward from the source in the shield trench through the body region to at least part of the drift region.

15. The method of making an iT-FET semiconductor device of claim 14, wherein the conductive plug is a tungsten plug extending upward from the source in the shield trench.

16. The method of making an iT-FET semiconductor device of claim 14, wherein the conductive plug is lined with titanium silicide extending upward from the source in the shield trench.

17. The method of making an iT-FET semiconductor device of claim 12, wherein d) further comprises forming a drift region between the body region and the drain contact region formed in the epitaxial layer wherein the drift region is more lightly doped with impurity of the first conductivity type than the heavily doped drain region.

18. The method of making an iT-FET semiconductor device of claim 17, wherein forming the drift region further comprises forming an impurity concentration gradient in the drift region wherein the impurity concentration is highest near the drain contact region and the ion concentration gradient decreases deeper into the epitaxial layer below the heavily doped drain region.

19. The method of making an iT-FET semiconductor device of claim 12, wherein h) further comprises lining the side walls of the shield trench with a shield insulator thicker than the insulation material in the gate trench.

20. The method of making an iT-FET semiconductor device of claim 12, wherein forming a drain on top of the epitaxial layer further comprises forming conductive drain contact plug in contact with the heavily doped drain region and a drain metal over top the drain contact plug.

* * * * *